(12) United States Patent
Lee (10) Patent No.: US 8,446,174 B2
(45) Date of Patent: May 21, 2013

(54) DATA OUTPUT CIRCUIT OF SEMICONDUCTOR APPARATUS

(75) Inventor: Dong Uk Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/283,805

(22) Filed: Oct. 28, 2011

(65) Prior Publication Data

US 2012/0250734 A1    Oct. 4, 2012

(30) Foreign Application Priority Data

Mar. 31, 2011    (KR) .................. 10-2011-0029685

(51) Int. Cl.
*H03K 19/00* (2006.01)

(52) U.S. Cl.
USPC ............... 326/93; 327/41; 327/141; 327/170; 375/211; 375/371

(58) Field of Classification Search
USPC .......... 326/82–83, 86–87, 93–98; 327/13–14, 327/39–41, 141, 146, 149, 170; 375/211, 375/371
See application file for complete search history.

(56) References Cited

U.S. PATENT DOCUMENTS

| 7,447,289 B2 * | 11/2008 | Uratani et al. | 375/371 |
| 2011/0102029 A1 * | 5/2011 | Gomm | 327/149 |
| 2011/0291722 A1 * | 12/2011 | Kim | 327/161 |

FOREIGN PATENT DOCUMENTS

| KR | 1020080074669 A | 8/2008 |
| KR | 10-0878310 B1 | 1/2009 |
| KR | 10-0897275 B1 | 5/2009 |
| KR | 1020090047992 A | 5/2009 |
| KR | 10-0964325 B1 | 6/2010 |

* cited by examiner

*Primary Examiner* — Jason M Crawford
(74) *Attorney, Agent, or Firm* — William Park & Associates Patent Ltd.

(57) ABSTRACT

A data output circuit of a semiconductor apparatus includes a clock skew compensation repeater configured to control a delay amount of a clock in response to skew compensation codes and output a data synchronization clock; a mismatch compensation driver configured to synchronize internal data with the data synchronization clock and output the internal data synchronized with the data synchronization clock by controlling a transition timing of the internal data according to mismatch compensation codes; and a data output driver configured to generate output data in response to an output of the mismatch compensation driver.

22 Claims, 6 Drawing Sheets

| MODE | R_skew<2> | R_skew<1> | R_skew<0> | F_skew<2> | F_skew<1> | F_skew<0> |
|---|---|---|---|---|---|---|
| Normal | 0 | 0 | 0 | 0 | 0 | 0 |
| RCLK Delay 1step | 0 | 0 | 1 | 0 | 0 | 0 |
| RCLK Delay 2step | 0 | 1 | 0 | 0 | 0 | 0 |
| RCLK Delay 3step | 0 | 1 | 1 | 0 | 0 | 0 |
| RCLK Delay 4step | 1 | 0 | 0 | 0 | 0 | 0 |
| RCLK Delay 5step | 1 | 0 | 1 | 0 | 0 | 0 |
| RCLK Delay 6step | 1 | 1 | 0 | 0 | 0 | 0 |
| RCLK Delay 7step | 1 | 1 | 1 | 0 | 0 | 0 |
| FCLK Delay 1step | 0 | 0 | 1 | 0 | 0 | 1 |
| FCLK Delay 2step | 0 | 0 | 0 | 0 | 1 | 0 |
| FCLK Delay 3step | 0 | 0 | 0 | 0 | 1 | 1 |
| FCLK Delay 4step | 0 | 0 | 0 | 1 | 1 | 0 |
| FCLK Delay 5step | 0 | 0 | 0 | 1 | 0 | 1 |
| FCLK Delay 6step | 0 | 0 | 0 | 1 | 1 | 0 |
| FCLK Delay 7step | 0 | 0 | 0 | 1 | 1 | 1 |

| MODE | D_mis<2> | D_mis<1> | D_mis<0> | Uhigh<1> | Uhigh<0> | Ulow<1> | Ulow<0> | Dhigh<1> | Dhigh<0> | Dlow<1> | Dlow<0> |
|---|---|---|---|---|---|---|---|---|---|---|---|
| Normal | 0 | 0 | 0 | 1 | 1 | 0 | 0 | 1 | 1 | 0 | 0 |
| Duty High 1step | 0 | 0 | 1 | 1 | 0 | 0 | 0 | 1 | 0 | 0 | 0 |
| Duty High 2step | 0 | 1 | 0 | 0 | 1 | 0 | 0 | 0 | 1 | 0 | 0 |
| Duty High 3step | 0 | 1 | 1 | 0 | 0 | 0 | 0 | 0 | 0 | 0 | 0 |
| Crossbar current | 1 | 0 | 1 | 1 | 1 | 1 | 1 | 1 | 1 | 1 | 1 |
| Duty Low 1step | 1 | 1 | 0 | 1 | 1 | 0 | 1 | 1 | 1 | 0 | 1 |
| Duty Low 2step | 1 | 1 | 1 | 1 | 1 | 1 | 0 | 1 | 1 | 1 | 0 |
| Duty Low 3step | 1 | 1 | 1 | 1 | 1 | 1 | 1 | 1 | 1 | 1 | 1 |

FIG.6

DATA OUTPUT CIRCUIT OF SEMICONDUCTOR APPARATUS

CROSS-REFERENCES TO RELATED APPLICATION

The present application claims priority under 35 U.S.C. §119(a) to Korean application number 10-2011-0029685, filed on Mar. 31, 2011, in the Korean Intellectual Property Office, which is incorporated herein by reference in its entirety as set forth in full.

BACKGROUND

1. Technical Field

The present invention relates generally to a semiconductor integrated circuit, and more particularly, to a data output circuit of a semiconductor apparatus.

2. Related Art

In general, a semiconductor apparatus is configured to store data and output stored data. Also, a semiconductor apparatus is configured to store data while receiving a clock from an outside and output stored data.

In detail, a semiconductor apparatus is configured to receive data from an outside in synchronization with a clock and output stored data to the outside in synchronization with a clock.

SUMMARY

A data output circuit of a semiconductor apparatus which can output normal data is described herein.

In an embodiment of the present invention, a data output circuit of a semiconductor apparatus includes: a clock skew compensation repeater configured to delay a clock in response to skew compensation codes and output a data synchronization clock, during an enable period of an output enable signal; a mismatch compensation driver configured to synchronize internal data with the data synchronization clock and output the internal data synchronized with the data synchronization clock by controlling a rising edge or a falling edge of the internal data according to mismatch compensation codes; and a data output driver configured to generate output data in response to an output of the mismatch compensation driver.

In an embodiment of the present invention, a data output circuit of a semiconductor apparatus includes: a clock skew compensation repeater group configured to delay a rising clock in response to rising skew compensation codes and output a rising data synchronization clock, and delay a falling clock in response to falling skew compensation codes and output a falling data synchronization clock, during an enable period of an output enable signal; a mismatch compensation driver control unit configured to synchronize rising internal data and falling internal data with the rising data synchronization clock and the falling data synchronization clock, determine a pull-up driving ability and a pull-down driving ability in response to mismatch compensation codes, drive the synchronized data using the determined pull-up and pull-down driving abilitys, and output pull-up data and pull-down data; and a data output driver configured to output data in response to the pull-up data and the pull-down data.

In an embodiment of the present invention, a data output circuit of a semiconductor apparatus includes: a first clock skew compensation repeater having a first transmission line for receiving and transmitting a rising clock to a first driver and configured to increase or decrease capacitance of the first transmission line in response to rising skew compensation codes, the first driver being configured to output the rising clock transmitted through the first transmission line, as a rising data synchronization clock; a second clock skew compensation repeater having a second transmission line for receiving and transmitting a falling clock to a second driver and configured to increase or decrease capacitance of the second transmission line in response to falling skew compensation codes, the second driver being configured to output the falling clock transmitted through the second transmission line, as a falling data synchronization clock; a mismatch compensation driver control unit configured to output rising internal data and falling internal data in synchronization with the rising data synchronization clock and the falling data synchronization clock; and a data output driver configured to generate output data in response to an output of the mismatch compensation driver control unit.

In an embodiment of the present invention, a data output circuit of a semiconductor apparatus includes: a clock skew compensation repeater group configured to receive a rising clock and a falling clock and output a rising data synchronization clock and a falling data synchronization clock; a mismatch compensation driver control unit configured to respectively synchronize rising internal data and falling internal data with the rising data synchronization clock and the falling data synchronization clock, and drive and output the synchronized data with driving abilitys according to mismatch compensation codes; and a data output driver configured to generate output data in response to an output of the mismatch compensation driver control unit.

BRIEF DESCRIPTION OF THE DRAWINGS

Features, aspects, and embodiments are described in conjunction with the attached drawings, in which.

DETAILED DESCRIPTION

Hereinafter, a data output circuit of a semiconductor apparatus according to the present invention will be described below with reference to the accompanying drawings through exemplary embodiments.

Figure 1:
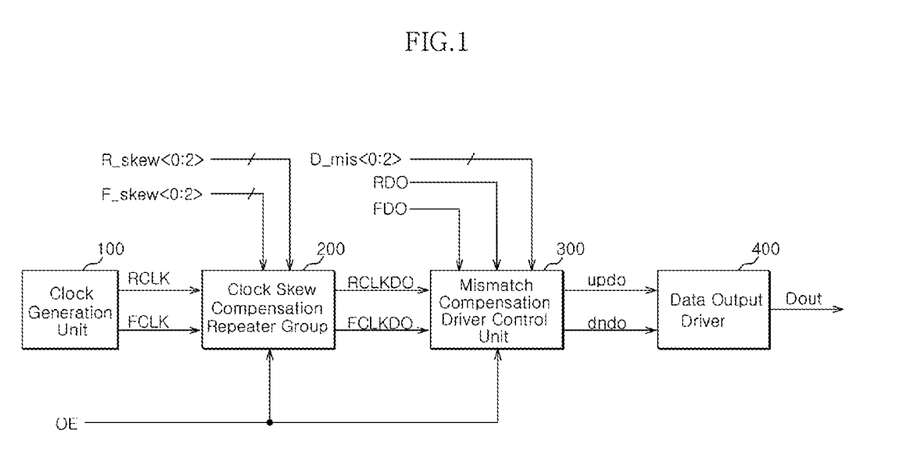
FIG. 1 is a configuration diagram of a data output circuit of a semiconductor apparatus in accordance with an embodiment of the present invention.

Referring to FIG. 1, a data output circuit of a semiconductor apparatus in accordance with an embodiment of the present invention includes a clock generation unit 100, a clock skew compensation repeater group 200, a mismatch compensation driver control unit 300, and a data output driver 400.

The clock generation unit 100 may include a DLL (delay locked loop) or a PLL (phase locked loop), and generate a rising clock RCLK and a falling clock FCLK.

The clock skew compensation repeater group 200 is configured to delay the rising clock RCLK in response to rising skew compensation codes R_skew<0:2> and output a rising data synchronization clock RCLKDO. Also, the clock skew compensation repeater group 200 is configured to delay the falling clock FCLK in response to falling skew compensation codes F_skew<0:2> and output a falling data synchronization clock FCLKDO, during the enable period of an output enable signal OE.

The mismatch compensation driver control unit 300 is configured to synchronize rising internal data RDO with the rising data synchronization clock RCLKDO, synchronize falling internal data FDO with the falling data synchronization clock FCLKDO, determine a pull-up driving ability and a pull-down driving ability in response to mismatch compensation codes D_mis<0:2>, drive the synchronized data using the determined pull-up and pull-down driving abilitys, and output pull-up data updo and pull-down data dndo.

The data output driver 400 is configured to output data Dout to an outside of the semiconductor apparatus in response to the pull-up data updo and the pull-down data dndo.

Figure 2:
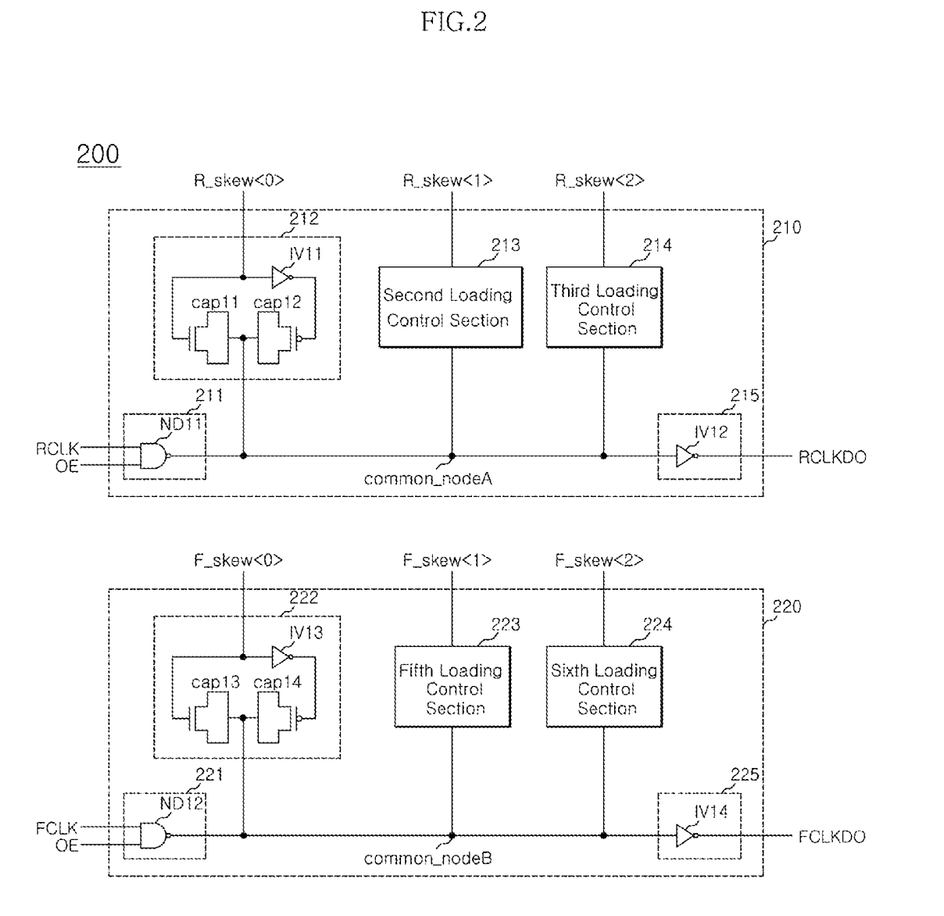
FIG. 2 is a configuration diagram of the clock skew compensation repeater group shown in FIG. 1.

Referring to FIG. 2, the clock skew compensation repeater group 200 includes a first clock skew compensation repeater 210, and a second clock skew compensation repeater 220.

The first clock skew compensation repeater 210 is configured to delay the rising clock RCLK in response to the rising skew compensation codes R_skew<0:2> and output the delayed rising clock RCLK as the rising data synchronization clock RCLKDO, during the enable period of the output enable signal OE.

The first clock skew compensation repeater 210 includes a first node level control section 211, first, second and third loading control sections 212, 213 and 214, and a first driver 215.

The first node level control section 211 is configured to change a voltage level of a first transmission line common_nodeA in response to the rising clock RCLK during the enable period of the output enable signal OE.

The first node level control section 211 includes a first NAND gate ND11. The first NAND gate ND11 has an input terminal which receives the rising clock RCLK and the output enable signal OE, and an output terminal to which the first transmission line common_nodeA is connected.

The first, second and third loading control sections 212, 213 and 214 are configured to increase or decrease the capacitance of the first transmission line common_nodeA in response to the rising skew compensation codes R_skew<0:2>. For example, if the code values of the rising skew compensation codes R_skew<0:2> increase, the first, second and third loading control sections 212, 213 and 214 increase the capacitance value of the first transmission line common_nodeA. That is to say, the respective first, second and third loading control sections 212, 213 and 214 determine whether to activate the capacitors connected to the first transmission line common_nodeA, in response to the rising skew compensation codes R_skew<0:2>.

The first, second and third loading control sections 212, 213 and 214 may be configured in the same manner. Therefore, only the configuration of the first loading control section 212 will be described, and descriptions of the configurations of the other loading control sections 213 and 214 will be omitted herein.

The first loading control section 212 includes a first capacitor cap11, a second capacitor cap12, and a first inverter IV11. The first inverter IV11 is inputted with a first bit R_skew<0> among the rising skew compensation codes R_skew<0:2>. The first capacitor cap11 has one end which is inputted with the first bit R_skew<0> among the rising skew compensation codes R_skew<0:2> and the other end to which the first transmission line common_nodeA is connected. The second capacitor cap12 has one end which is inputted with the output signal of the first inverter IV11 and the other end to which the first transmission line common_nodeA is connected. Thus, in the first loading control section 212, if the level of the first bit R_skew<0> among the rising skew compensation codes R_skew<0:2> is a high level, the first and second capacitors cap11 and cap12 are activated, and the capacitance, that is, the loading, of the first transmission line common_nodeA increases.

The first driver 215 is configured to drive the voltage of the first transmission line common_nodeA and output the rising data synchronization clock RCLKDO.

The first driver 215 includes a second inverter IV12. The second inverter IV12 has an input terminal to which the first transmission line common_nodeA is connected and an output terminal which outputs the rising data synchronization clock RCLKDO.

The second clock skew compensation repeater 220 is configured to delay the falling clock FCLK in response to the falling skew compensation codes F_skew<0:2> and output the delayed falling clock FCLK as the falling data synchronization clock FCLKDO, during the enable period of the output enable signal OE.

The second clock skew compensation repeater 220 includes a second node level control section 221, fourth, fifth and sixth loading control sections 222, 223 and 224, and a second driver 225.

The second node level control section 221 is configured to change a voltage level of a second transmission line common_nodeB in response to the falling clock FCLK during the enable period of the output enable signal OE.

The second node level control section 221 includes a second NAND gate ND12. The second NAND gate ND12 has an input terminal which receives the falling clock FCLK and the output enable signal OE and an output terminal to which the second transmission line common_nodeB is connected.

The fourth, fifth and sixth loading control sections 222, 223 and 224 are configured to increase or decrease the capacitance of the second transmission line common_nodeB in response to the falling skew compensation codes F_skew<0:2>. For example, if the code values of the falling skew compensation codes F_skew<0:2> increase, the fourth, fifth and sixth loading control sections 222, 223 and 224 increase the capacitance value of the second transmission line common_nodeB. That is to say, the respective fourth, fifth and sixth loading control sections 222, 223 and 224 determine whether to activate the capacitors connected to the second transmission line common_nodeB, in response to the falling skew compensation codes F_skew<0:2>.

The fourth, fifth and sixth loading control sections 222, 223 and 224 may be configured in the same manner. Therefore, only the configuration of the fourth loading control section 222 will be described, and descriptions of the configurations of the other loading control sections 223 and 224 will be omitted herein.

The fourth loading control section 222 includes a third capacitor cap13, a fourth capacitor cap14, and a third inverter IV13. The third inverter IV13 is inputted with a first bit F_skew<0> among the falling skew compensation codes F_skew<0:2>. The third capacitor cap13 has one end which is inputted with the first bit F_skew<0> among the falling skew compensation codes F_skew<0:2> and the other end to which the second transmission line common_nodeB is connected. The fourth capacitor cap14 has one end which is inputted with the output signal of the third inverter IV13 and the other end to which the second transmission line common_nodeB is connected. Thus, in the fourth loading control section 222, if the level of the first bit F_skew<0> among the falling skew compensation codes F_skew<0:2> is a high level, the third and fourth capacitors cap13 and cap14 are activated, and the capacitance, that is, the loading, of the second transmission line common_nodeB increases.

The second driver 225 is configured to drive the voltage of the second transmission line common_nodeB and output the falling data synchronization clock FCLKDO.

The second driver 225 includes a fourth inverter IV14. The fourth inverter IV14 has an input terminal to which the second transmission line common_nodeB is connected and an output terminal which outputs the falling data synchronization clock FCLKDO.

Figure 3:
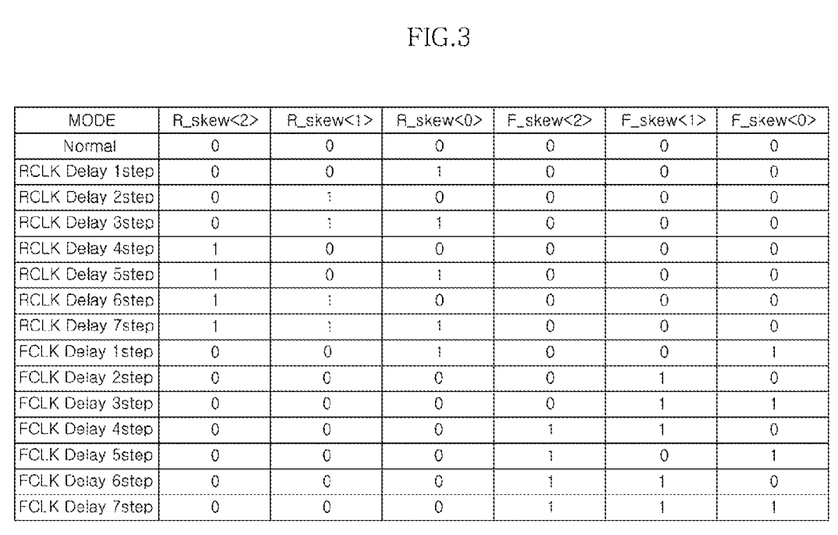
FIG. 3 is a code table by delay steps, of the clock skew compensation repeater group shown in FIG. 2.

FIG. 3 is a code table by delay steps, of the clock skew compensation repeater group 200 shown in FIG. 2. If the code values of the rising skew compensation codes R_skew<0:2> and the falling skew compensation codes F_skew<0:2> are all 0, 0, 0, both the rising clock RCLK and the falling clock FCLK are not delayed (a normal state).

If the code values of the rising skew compensation codes R_skew<0:2> increase, the number of the delay step of the rising clock RCLK increases. If the number of the delay step of the rising click RCLK increases, the rising clock RCLK is delayed more. In other words, if the code values of the rising skew compensation codes R_skew<0:2> increase during the period in which the output enable signal OE is enabled, since the capacitance value of the first transmission line common_nodeA increases, the rising clock RCLK is delayed more and outputted as the rising data synchronization clock RCLKDO.

If the code values of the falling skew compensation codes F_skew<0:2> increase, the number of the delay step of the falling clock FCLK increases. If the number of the delay step of the falling click FCLK increases, the falling clock FCLK is delayed more. In other words, if the code values of the falling skew compensation codes F_skew<0:2> increase during the period in which the output enable signal OE is enabled, since the capacitance value of the second transmission line common_nodeB increases, the falling clock FCLK is delayed more and outputted as the falling data synchronization clock FCLKDO by being delayed more.

Figure 4:
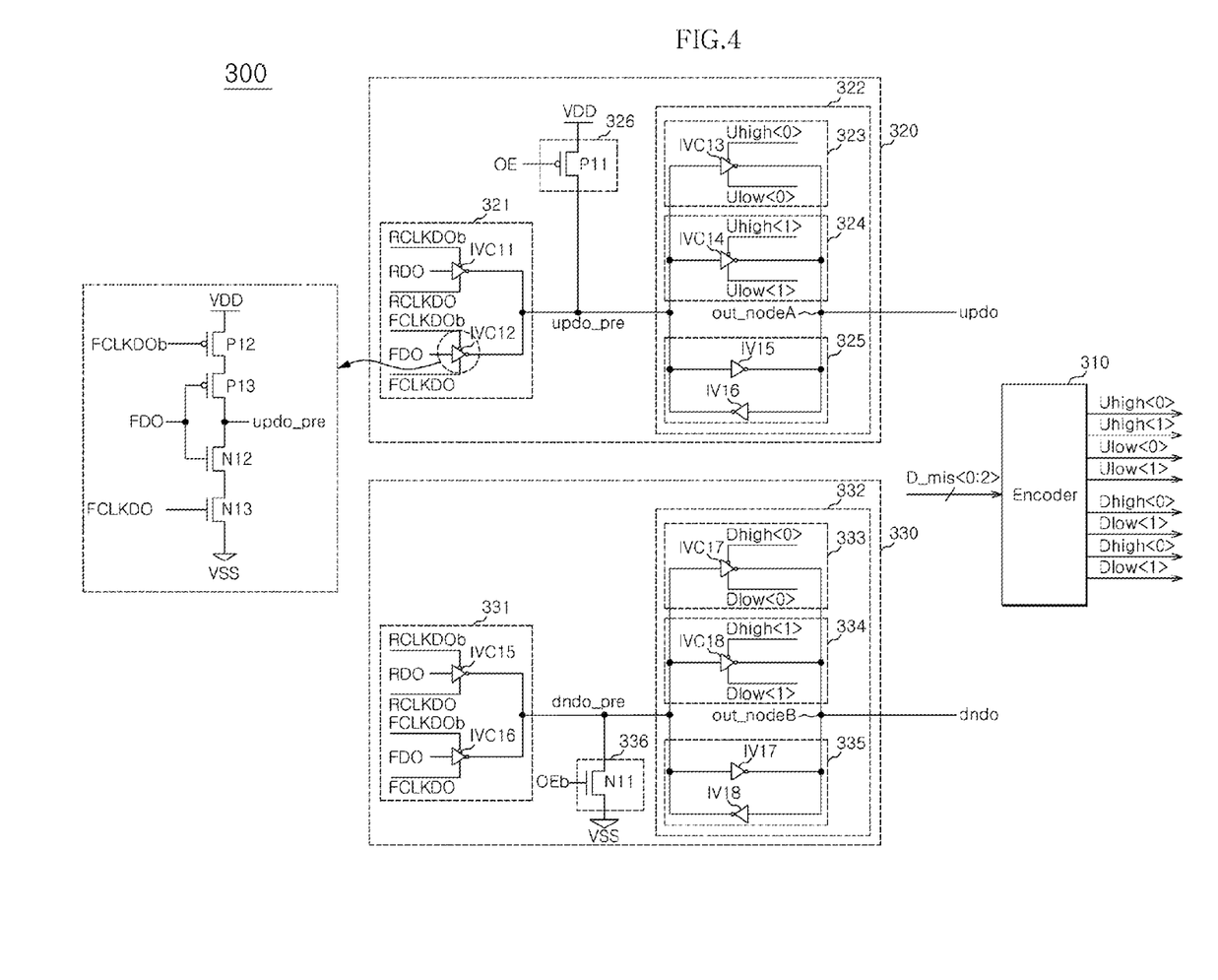
FIG. 4 is a configuration diagram of the mismatch compensation driver control unit shown in FIG. 1.

Referring to FIG. 4, the mismatch compensation driver control unit 300 includes an encoder 310, a pull-up mismatch compensation driver 320, and a pull-down mismatch compensation driver 330.

The encoder 310 is configured to encode the mismatch compensation codes D_mis<0:2> and generate first, second, third and fourth pull-up data duty control signals uhigh<0:1> and ulow<0:1> and first, second, third and fourth pull-down data duty control signals dhigh<0:1> and dlow<0:1>.

The pull-up mismatch compensation driver 320 is configured to synchronize the rising internal data RDO with the rising data synchronization clock RCLKDO and synchronize the falling internal data FDO with the falling data synchronization clock FCLKDO, and generate preliminary pull-up data updo_pre. The pull-up mismatch compensation driver 320 determines a first pull-up driving ability and a first pull-down driving ability in response to the first, second, third and fourth pull-up data duty control signals uhigh<0:1> and ulow<0:1>, drives the preliminary pull-up data updo_pre using the determined first pull-up and pull-down driving abilitys, and generates the pull-up data updo.

The pull-up mismatch compensation driver 320 includes a first synchronizing section 321, and a pull-up data compensation driving section 322.

The first synchronizing section 321 is configured to synchronize the rising internal data RDO with the rising data synchronization clock RCLKDO and synchronize the falling internal data FDO with the falling data synchronization clock FCLKDO, and generate the preliminary pull-up data updo_pre.

The first synchronizing section 321 includes first and second control inverters IVC11 and IVC12. The first control inverter IVC11 has a first control terminal which receives an inverted rising data synchronization clock RCLKDOb, a second control terminal which receives the rising data synchronization clock RCLKDO, and an input terminal which receives the rising internal data RDO. The second control inverter IVC12 has a first control terminal which receives an inverted falling data synchronization clock FCLKDOb, a second control terminal which receives the falling data synchronization clock FCLKDO, and an input terminal which receives the falling internal data FDO. The preliminary pull-up data updo_pre is outputted from a node to which the respective output terminals of the first and second control inverters IVC11 and IVC12 are commonly connected.

The pull-up data compensation driving section 322 is configured to determine the first pull-up driving ability and the first pull-down driving ability in response to the first, second, third and fourth pull-up data duty control signals uhigh<0:1> and ulow<0:1>, drive the preliminary pull-up data updo_pre using the determined first pull-up driving ability and first pull-down driving ability, and generate the pull-up data updo.

The pull-up data compensation driving section 322 includes first and second compensation drivers 323 and 324 and a first latch part 325.

The first compensation driver 323 is configured to pull up a first output node out_nodeA when the first pull-up data duty control signal uhigh<0> has a low level and the preliminary pull-up data updo_pre has a low level, and pull down the first output node out_nodeA when the third pull-up data duty control signal ulow<0> has a high level and the preliminary pull-up data updo_pre has a high level.

The first compensation driver 323 includes a third control inverter IVC13. The third control inverter IVC13 has a first control terminal which receives the first pull-up data duty control signal uhigh<0>, a second control terminal which receives the third pull-up data duty control signal ulow<0>, an input terminal which receives the preliminary pull-up data updo_pre, and an output terminal to which the first output node out_nodeA is connected.

The second compensation driver 324 is configured to pull up the first output node out_nodeA when the second pull-up data duty control signal uhigh<1> has a low level and the preliminary pull-up data updo_pre has a low level, and pull down the first output node out_nodeA when the fourth pull-up data duty control signal ulow<1> has a high level and the preliminary pull-up data updo_pre has a high level.

The second compensation driver 324 includes a fourth control inverter IVC14. The fourth control inverter IVC14 has a first control terminal which receives the second pull-up data duty control signal uhigh<1>, a second control terminal which receives the fourth pull-up data duty control signal ulow<1>, an input terminal which receives the preliminary pull-up data updo_pre, and an output terminal to which the first output node out_nodeA is connected.

The first latch part 325 is configured to latch and transfer the preliminary pull-up data updo_pre to the first output node out_nodeA.

The first latch part 325 includes fifth and sixth inverters IV15 and IV16. The fifth inverter IV15 has an input terminal which receives the preliminary pull-up data updo_pre and an output terminal to which the first output node out_nodeA is connected. The sixth inverter IV16 has an input terminal to which the output terminal of the fifth inverter IV15 is connected and an output terminal which is connected to the input terminal of the fifth inverter IV15. The pull-up data updo is outputted from the first output node out_nodeA, and the pull-up and pull-down driving abilitys of the first and second compensation drivers 323 and 324 may be different from each other. The sum of the pull-up driving abilitys of the first and second compensation drivers 323 and 324 becomes the first pull-up driving ability. Also, the sum of the pull-down driving abilitys of the first and second compensation drivers 323 and 324 becomes the first pull-down driving ability. Therefore, if the pull-up driving abilitys of the first and second compensation drivers 323 and 324 increase, the slope of the rising edge of the pull-up data updo increases and the magnitude of the high pulse width of the pull-up data updo increases, and if the pull-down driving abilitys of the first and second compensation drivers 323 and 324 increase, the slope of the falling edge of the pull-up data updo increases and the magnitude of the low pulse width of the pull-up data updo increases.

The pull-up mismatch compensation driver 320 may further include a first initialization part 326. The first initialization part 326 is configured to lock the preliminary pull-up data updo-pre to a specified level, that is, a high level, when the output enable signal OE is disabled.

The first initialization part 326 includes a first transistor P11. The first transistor P11 has a gate which receives the output enable signal OE, a source which is applied with an external voltage VDD, and a drain to which a node for transferring the preliminary pull-up data updo_pre is connected.

The pull-down mismatch compensation driver 330 is configured to synchronize the rising internal data RDO with the rising data synchronization clock RCLKDO and synchronize the falling internal data FDO with the falling data synchronization clock FCLKDO, and generate preliminary pull-down data dndo_pre. The pull-down mismatch compensation driver 330 determines a second pull-up driving ability and a second pull-down driving ability in response to the first, second, third and fourth pull-down data duty control signals dhigh<0:1> and dlow<0:1>, drives the preliminary pull-down data dndo_pre using the determined second pull-up and pull-down driving abilitys, and generates the pull-down data dndo.

The pull-down mismatch compensation driver 330 includes a second synchronizing section 331, and a pull-down data compensation driving section 332.

The second synchronizing section 331 is configured to synchronize the rising internal data RDO with the rising data synchronization clock RCLKDO and synchronize the falling internal data FDO with the falling data synchronization clock FCLKDO, and generate the preliminary pull-down data dndo_pre.

The second synchronizing section 331 includes fifth and sixth control inverters IVC15 and IVC16. The fifth control inverter IVC15 has a first control terminal which receives the inverted rising data synchronization clock RCLKDOb, a second control terminal which receives the rising data synchronization clock RCLKDO, and an input terminal which receives the rising internal data RDO. The sixth control inverter IVC16 has a first control terminal which receives the inverted falling data synchronization clock FCLKDOb, a second control terminal which receives the falling data synchronization clock FCLKDO, and an input terminal which receives the falling internal data FDO. The preliminary pull-down data dndo_pre is outputted from a node to which the respective output terminals of the fifth and sixth control inverters IVC15 and IVC16 are commonly connected.

The pull-down data compensation driving section 332 is configured to determine the second pull-up driving ability and the second pull-down driving ability in response to the first, second, third and fourth pull-down data duty control signals dhigh<0:1> and dlow<0:1>, drive the preliminary pull-down data dndo_pre using the determined second pull-up driving ability and second pull-down driving ability, and generate the pull-down data dndo.

The pull-down data compensation driving section 332 includes third and fourth compensation drivers 333 and 334 and a second latch part 335.

The third compensation driver 333 is configured to pull up a second output node out_nodeB when the first pull-down data duty control signal dhigh<0> has a low level and the preliminary pull-down data dndo_pre has a low level, and pull down the second output node out_nodeB when the third pull-down data duty control signal dlow<0> has a high level and the preliminary pull-down data dndo_pre has a high level.

The third compensation driver 333 includes a seventh control inverter IVC17. The seventh control inverter IVC17 has a first control terminal which receives the first pull-down data duty control signal dhigh<0>, a second control terminal which receives the third pull-down data duty control signal dlow<0>, an input terminal which receives the preliminary pull-down data dndo_pre, and an output terminal to which the second output node out_nodeB is connected.

The fourth compensation driver 334 is configured to pull up the second output node out_nodeB when the second pull-down data duty control signal dhigh<1> has a low level and the preliminary pull-down data dndo_pre has a low level, and pull down the second output node out_nodeB when the fourth pull-down data duty control signal dlow<1> has a high level and the preliminary pull-down data dndo_pre has a high level.

The fourth compensation driver 334 includes an eighth control inverter IVC18. The eighth control inverter IVC18 has a first control terminal which receives the second pull-down data duty control signal dhigh<1>, a second control terminal which receives the fourth pull-down data duty control signal dlow<1>, an input terminal which receives the preliminary pull-down data dndo_pre, and an output terminal to which the second output node out_nodeB is connected.

The second latch part 335 is configured to latch and transfer the preliminary pull-down data dndo_pre to the second output node out_nodeB.

The second latch part 335 includes seventh and eighth inverters IV17 and IV18. The seventh inverter IV17 has an input terminal which receives the preliminary pull-down data dndo_pre and an output terminal to which the second output node out_nodeB is connected. The eighth inverter IV18 has an input terminal to which the output terminal of the seventh inverter IV17 is connected and an output terminal which is connected to the input terminal of the seventh inverter IV17. The pull-down data dndo is outputted from the second output node out_nodeB, and the pull-up and pull-down driving abilitys of the third and fourth compensation drivers 333 and 334 may be different from each other. The sum of the pull-up driving abilitys of the third and fourth compensation drivers 333 and 334 becomes the second pull-up driving ability. Also, the sum of the pull-down driving abilitys of the third and fourth compensation drivers 333 and 334 becomes the second pull-down driving ability. Therefore, if the pull-up driving abilitys of the third and fourth compensation drivers 333 and 334 increase, the slope of the rising edge of the pull-down data dndo increases and the magnitude of the high pulse width of the pull-down data dndo increases, and if the pull-down driving abilitys of the third and fourth compensation drivers 333 and 334 increase, the slope of the falling edge of the pull-down data dndo increases and the magnitude of the low pulse width of the pull-down data dndo increases.

The pull-down mismatch compensation driver 330 may further include a second initialization part 336. The second initialization part 336 is configured to lock the preliminary pull-down data dndo-pre to a specified level, that is, a low level, when the output enable signal OE is disabled.

The second initialization part 336 includes a second transistor N11. The second transistor N11 has a gate which receives an inverted output enable signal OEb, a drain to which a node for transferring the preliminary pull-down data dndo_pre is connected, and a source to which a ground terminal VSS is connected.

The first, second, . . . , and eighth control inverters IVC11, IVC12, . . . , and IVC18 may be configured in the same manner. Therefore, only the configuration of the second control inverter IVC12 will be described, and descriptions of the configurations of the other control inverters IVC11 and IVC13 to IVC18 will be omitted herein.

The second control inverter IVC12 includes third, fourth, fifth and sixth transistors P12, P13, N12 and N13. The third transistor P12 has a gate which receives the inverted falling data synchronization clock FCLKDOb and a source which is applied with the external voltage VDD. The fourth transistor P13 has a gate which receives the falling internal data FDO and a source to which the drain of the third transistor P12 is connected. The fifth transistor N12 has a gate which receives the falling internal data FDO and a drain to which the drain of the fourth transistor P13 is connected. The sixth transistor N13 has a gate which receives the falling data synchronization clock FCLKDO, a drain to which the source of the fifth transistor N12 is connected, and a source to which the ground terminal VSS is connected. The preliminary pull-up data updo_pre is outputted from the node to which the fourth and fifth transistors P13 and N12 are commonly connected.

Figure 5:
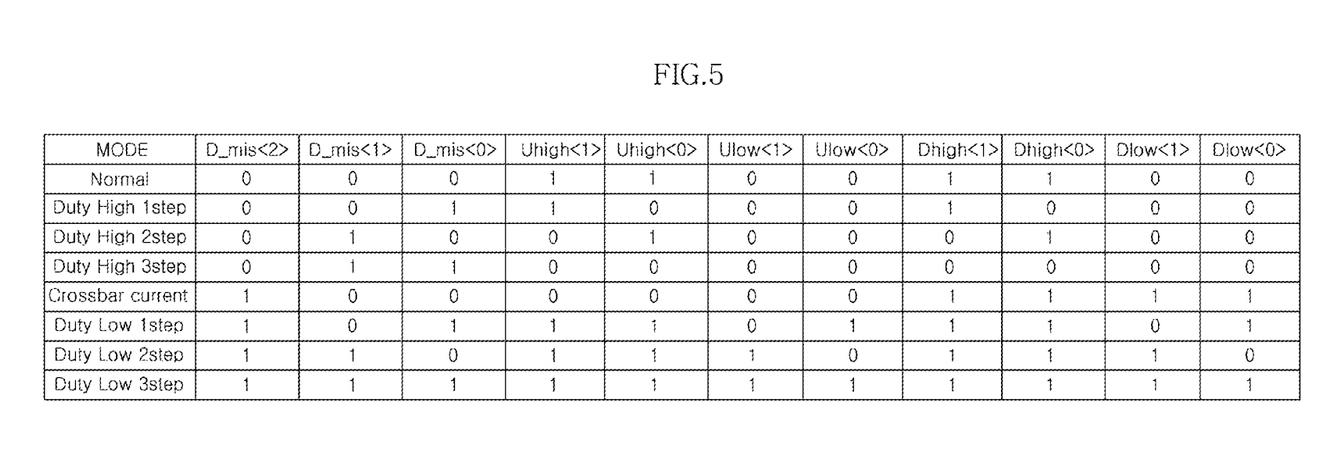
FIG. 5 is a duty correction code table of the mismatch compensation drivers shown in FIG. 4.

FIG. 5 shows results of encoding the mismatch compensation codes D_mis<0:2> by the encoder 310 shown in FIG. 4, that is, the first, second, third and fourth pull-up data duty control signals uhigh<0:1> and ulow<0:1> and the first, second, third and fourth pull-down data duty control signals dhigh<0:1> and dlow<0:1> depending upon the mismatch compensation codes D_mis<0:2>. Also, FIG. 5 shows high pulse width control steps, that is, duty high steps, and low pulse width control steps, that is, duty low steps, for the pull-up data updo and the pull-down data dndo by the mismatch compensation driver control unit 300 using the first, second, third and fourth pull-up data duty control signals uhigh<0:1> and ulow<0:1> and the first, second, third and fourth pull-down data duty control signals dhigh<0:1> and dlow<0:1> depending upon the mismatch compensation codes D_mis<0:2>. In detail, configuration may be implemented such that the magnitudes of the high pulse widths of the pull-up data updo and the pull-down data dndo increase as the number of the high pulse width control steps, that is, the number of the duty high steps increases. Also, configuration may be implemented such that the magnitudes of the low pulse widths of the pull-up data updo and the pull-down data dndo increase as the number of the low pulse width control steps, that is, the number of the duty low steps increases. In FIG. 5, Normal indicates that the magnitudes of the high or low pulse widths of the preliminary pull-up data updo_pre and the preliminary pull-down data dndo_pre are the same as the magnitudes of the high or low pulse widths of the pull-up data updo and the pull-down data dndo.

Figure 6:
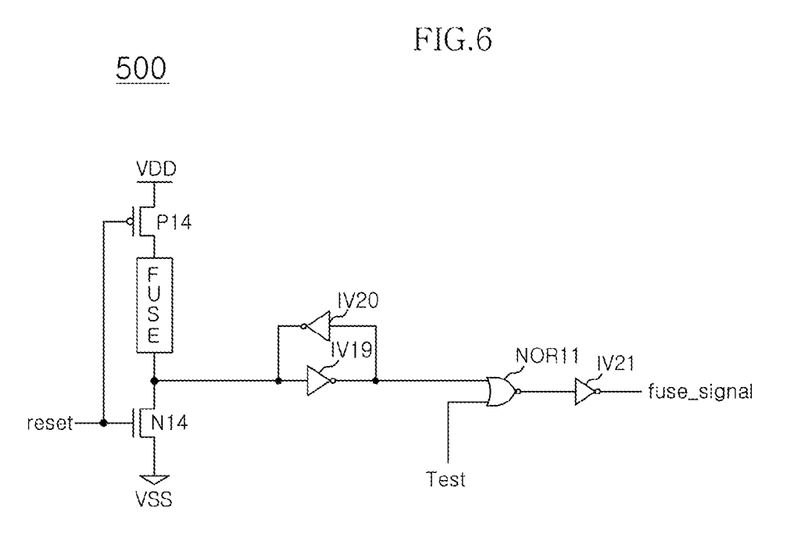
FIG. 6 is a configuration diagram of a fuse signal generation unit.

The respective bit signals of the rising skew compensation codes R_skew<0:2>, the falling skew compensation codes F_skew<0:2> and the mismatch compensation codes D_mis<0:2> employed in an embodiment of the present invention are signals which are generated from a fuse signal generation unit 500 shown in FIG. 6.

The fuse signal generation unit 500 may determine the level of a fuse signal fuse_signal in response to a test signal Test. According to an example, when the test signal Test is disabled to a low level, the fuse signal generation unit 500 may determine the level of the fuse signal fuse_signal depending upon whether a fuse FUSE is cut or not.

The fuse signal generation unit 500 includes seventh and eighth transistors P14 and N14, the fuse FUSE, ninth, tenth and eleventh inverters IV19, IV20 and IV21, and a NOR gate NOR11. The seventh transistor P14 has a gate which receives a reset signal reset, and a source which is applied with the external voltage VDD. The fuse FUSE has one end to which the drain of the seventh transistor P14 is connected. The eighth transistor N14 has a gate which receives the reset signal reset, a drain to which the other end of the fuse FUSE is connected, and a source to which the ground terminal VSS is connected. The ninth inverter IV19 has an input terminal to which a node connecting the other end of the fuse FUSE and the eighth transistor N14 is connected. The tenth inverter IV20 has an input terminal to which the output terminal of the ninth inverter IV19 is connected and an output terminal which is connected to the input terminal of the ninth inverter IV19. The NOR gate NOR11 receives the output signal of the ninth inverter IV19 and the test signal Test. The eleventh inverter IV21 receives the output signal of the NOR gate NOR11 and outputs the fuse signal fuse_signal.

Hereafter, operations of the data output circuit of a semiconductor apparatus in accordance with an embodiment of the present invention, configured as mentioned above, will be described with reference to FIGS. 1 to 5.

The clock generation unit 100 generates the rising clock RCLK and the falling clock FCLK. The clock skew compensation repeater group 200 determines a delay amount for delaying the rising clock RCLK, in response to the rising skew compensation codes R_skew<0:2>, delays the rising clock RCLK using the determined delay amount during the enable period of the output enable signal OE, and outputs the rising data synchronization clock RCLKDO. Further, the clock skew compensation repeater group 200 determines a delay amount for delaying the falling clock FCLK, in response to the falling skew compensation codes F_skew<0:2>, delays the falling clock FCLK using the determined delay amount during the enable period of the output enable signal OE, and outputs the falling data synchronization clock FCLKDO. The clock skew compensation repeater group 200 is configured to minimize the skews of the rising data synchronization clock RCLKDO and the falling data synchronization clock FCLKDO. As can be seen from FIG. 3, the delay amount of the rising clock RCLK may be increased or decreased by increasing or decreasing the number of the delay step of the rising clock RCLK according to the rising skew compensation codes R_skew<0:2>, and the delay amount of the falling clock FCLK may be increased or decreased by increasing or decreasing the number of the delay step of the falling click FCLK according to the falling skew compensation codes F_skew<0:2>.

The mismatch compensation driver control unit 300 synchronizes the rising internal data RDO with the rising data synchronization clock RCLKDO and outputs the synchronized rising internal data RDO as the pull-up data updo. The magnitude of the high pulse width or the low pulse width of the pull-up data updo is determined in response to the mismatch compensation codes D_mis<0:2>. Further, the mismatch compensation driver control unit 300 synchronizes the falling internal data FDO with the falling data synchronization clock FCLKDO and outputs the synchronized falling internal data FDO as the pull-down data dndo. The magnitude of the high pulse width or the low pulse width of the pull-down data dndo is determined in response to the mismatch compensation codes D_mis<0:2>.

The mismatch compensation driver control unit 300 is configured to control the magnitude of the high pulse width or the low pulse width of the pull-up data updo in response to the mismatch compensation codes D_mis<0:2> so as to control the duty of the pull-up data updo. In detail, the mismatch compensation driver control unit 300 is configured to determine the pull-up driving ability and the pull-down driving ability of the pull-up data updo according to the mismatch compensation codes D_mis<0:2> so as to control the magnitude of the high pulse width or the low pulse width of the pull-up data updo. Furthermore, the mismatch compensation driver control unit 300 is configured to control the magnitude of the high pulse width or the low pulse width of the pull-down data dndo in response to the mismatch compensation codes D_mis<0:2> so as to control the duty of the pull-down data dndo. In detail, the mismatch compensation driver control unit 300 is configured to determine the pull-up driving ability and the pull-down driving ability of the pull-down data dndo according to the mismatch compensation codes D_mis<0:2> so as to control the magnitude of the high pulse width or the low pulse width of the pull-down data dndo.

The data output driver 400 outputs the output data Dout to the outside of the semiconductor apparatus in response to the pull-up data updo and the pull-down data dndo.

Therefore, in an embodiment of the present invention, even when a skew occurs between the rising clock RCLK and the falling clock FCLK, the clock skew compensation repeater group 200 may compensate for the skew between the rising clock RCLK and the falling clock FCLK. The mismatch compensation driver control unit 300 may compensate for a mismatch between the pull-up data updo and the pull-down data dndo by controlling the duties of the pull-up data updo and the pull-down data dndo. Accordingly, in an embodiment of the present invention, the output data Dout to be outputted to the outside of the semiconductor apparatus may be optimized.

While certain embodiments have been described above, it will be understood to those skilled in the art that the embodiments described are by way of example only. Accordingly, the data output circuit of a semiconductor apparatus described herein should not be limited based on the described embodiments. Rather, the data output circuit of a semiconductor apparatus described herein should only be limited in light of the claims that follow when taken in conjunction with the above description and accompanying drawings.

What is claimed is:

1. A data output circuit of a semiconductor apparatus, comprising:
  a clock skew compensation repeater configured to control a delay amount of a clock in response to skew compensation codes and output a data synchronization clock;
  a mismatch compensation driver configured to synchronize internal data with the data synchronization clock and output the internal data synchronized with the data synchronization clock by controlling a transition timing of the internal data according to mismatch compensation codes; and
  a data output driver configured to generate output data in response to an output of the mismatch compensation driver.

2. The data output circuit according to claim 1, wherein code values of the skew compensation codes and the mismatch compensation codes are generated depending upon a test signal or whether a fuse is cut or not.

3. The data output circuit according to claim 1, wherein the clock skew compensation repeater comprises:
  a plurality of loading control sections configured to control loading of a transmission line in response to the skew compensation codes; and
  a driver configured to drive a signal transmitted through the transmission line and output the data synchronization clock.

4. The data output circuit according to claim 3, wherein the plurality of respective loading control sections control whether to activate capacitors connected to the transmission line, in response to the skew compensation codes.

5. The data output circuit according to claim 1, wherein the mismatch compensation driver comprises:
  a synchronizing section configured to output the internal data in synchronization with the data synchronization clock; and
  a compensation driving section configured to drive an output of the synchronizing section with a driving ability determined according to the mismatch compensation codes.

6. The data output circuit according to claim 5, wherein the compensation driving section determines a pull-up driving ability and a pull-down driving ability in response to the mismatch compensation codes and drives and outputs the output of the synchronizing section with the determined pull-up driving ability and pull-down driving ability.

7. A data output circuit of a semiconductor apparatus, comprising:
  a clock skew compensation repeater group configured to delay a rising clock in response to rising skew compensation codes and output a rising data synchronization clock, and delay a falling clock in response to falling skew compensation codes and output a falling data synchronization clock;
  a mismatch compensation driver control unit configured to synchronize rising internal data and falling internal data with the rising data synchronization clock and the falling data synchronization clock, determine a pull-up driving ability and a pull-down driving ability in response to mismatch compensation codes, drive the synchronized data using the determined pull-up and pull-down driving abilitys, and output pull-up data and pull-down data; and
  a data output driver configured to output data in response to the pull-up data and the pull-down data.

8. The data output circuit according to claim 7, wherein the clock skew compensation repeater group comprises:
  a first clock skew compensation repeater configured to delay the rising clock in response to the rising skew compensation codes and output the rising data synchronization clock, during an enable period of an output enable signal; and
  a second clock skew compensation repeater configured to delay the falling clock in response to the falling skew compensation codes and output the falling data synchronization clock, during the enable period of the output enable signal.

9. The data output circuit according to claim 8, wherein the first clock skew compensation repeater comprises:

a node level control section configured to change a voltage level of a transmission line in response to the rising clock during the enable period of the output enable signal;

a plurality of loading control sections configured to increase or decrease capacitance of the transmission line in response to the rising skew compensation codes; and a driver configured to drive a voltage of the transmission line and output the rising data synchronization clock.

10. The data output circuit according to claim 9, wherein the plurality of loading control sections increase a capacitance value of the transmission line when code values of the rising skew compensation codes increase.

11. The data output circuit according to claim 10, wherein the second clock skew compensation repeater comprises:

a node level control section configured to change a voltage level of a transmission line in response to the falling clock during the enable period of the output enable signal;

a plurality of loading control sections configured to increase or decrease capacitance of the transmission line in response to the falling skew compensation codes; and a driver configured to drive a voltage of the transmission line and output the falling data synchronization clock.

12. The data output circuit according to claim 11, wherein the plurality of loading control sections increase a capacitance value of the transmission line when code values of the falling skew compensation codes increase.

13. The data output circuit according to claim 7, wherein the mismatch compensation driver control unit comprises:

an encoder configured to encode the mismatch compensation codes and generate pull-up data duty control signals and pull-down data duty control signals;

a pull-up mismatch compensation driver configured to synchronize the rising internal data with the rising data synchronization clock and synchronize the falling internal data with the falling data synchronization clock, generate preliminary pull-up data, determine a first pull-up driving ability and a first pull-down driving ability in response to the pull-up data duty control signals, drive the preliminary pull-up data using the determined first pull-up and pull-down driving abilitys, and generate the pull-up data; and a pull-down mismatch compensation driver configured to synchronize the rising internal data with the rising data synchronization clock and synchronize the falling internal data with the falling data synchronization clock, generate preliminary pull-down data, determine a second pull-up driving ability and a second pull-down driving ability in response to the pull-down data duty control signals, drive the preliminary pull-down data using the determined second pull-up and pull-down driving abilitys, and generate the pull-down data.

14. The data output circuit according to claim 13, wherein the pull-up mismatch compensation driver comprises:

a synchronizing section configured to synchronize the rising internal data with the rising data synchronization clock and synchronize the falling internal data with the falling data synchronization clock, and generate the preliminary pull-up data; and a plurality of compensation drivers configured to determine the first pull-up driving ability and the first pull-down driving ability in response to the pull-up data duty control signals, drive the preliminary pull-up data using the determined first pull-up driving ability and first pull-down driving ability, and output the pull-up data.

15. The data output circuit according to claim 14, wherein the pull-up mismatch compensation driver further comprises:

an initialization part configured to lock the preliminary pull-up data to a specified level in response to the output enable signal.

16. The data output circuit according to claim 13, wherein the pull-down mismatch compensation driver comprises:

a synchronizing section configured to synchronize the rising internal data with the rising data synchronization clock and synchronize the falling internal data with the falling data synchronization clock, and generate the preliminary pull-down data; and a plurality of compensation drivers configured to determine the second pull-up driving ability and the second pull-down driving ability in response to the pull-down data duty control signals, drive the preliminary pull-down data using the determined second pull-up driving ability and second pull-down driving ability, and output the pull-down data.

17. The data output circuit according to claim 16, wherein the pull-down mismatch compensation driver further comprises:

an initialization part configured to lock the preliminary pull-down data to a specified level in response to the output enable signal.

18. A data output circuit of a semiconductor apparatus, comprising:

a first clock skew compensation repeater having a first transmission line for receiving and transmitting a rising clock to a first driver and configured to increase or decrease capacitance of the first transmission line in response to rising skew compensation codes, the first driver being configured to output the rising clock transmitted through the first transmission line, as a rising data synchronization clock;

a second clock skew compensation repeater having a second transmission line for receiving and transmitting a falling clock to a second driver and configured to increase or decrease capacitance of the second transmission line in response to falling skew compensation codes, the second driver being configured to output the falling clock transmitted through the second transmission line, as a falling data synchronization clock;

a mismatch compensation driver control unit configured to output rising internal data and falling internal data in synchronization with the rising data synchronization clock and the falling data synchronization clock; and a data output driver configured to generate output data in response to an output of the mismatch compensation driver control unit.

19. The data output circuit according to claim 18, wherein the first clock skew compensation repeater and the second clock skew compensation repeater control whether to activate a plurality of capacitors connected to the first transmission line and the second transmission line, in response to the rising skew compensation codes and the falling skew compensation codes.

20. A data output circuit of a semiconductor apparatus, comprising:

a clock skew compensation repeater group configured to receive a rising clock and a falling clock and output a rising data synchronization clock and a falling data synchronization clock;

a mismatch compensation driver control unit configured to respectively synchronize rising internal data and falling internal data with the rising data synchronization clock and the falling data synchronization clock, and drive and output the synchronized data with driving abilitys according to mismatch compensation codes; and a data output driver configured to generate output data in response to an output of the mismatch compensation driver control unit.

21. The data output circuit according to claim 20, wherein the mismatch compensation driver control unit comprises:
- an encoder configured to encode the mismatch compensation codes and generate pull-up data duty control signals and pull-down data duty control signals;
- a pull-up mismatch compensation driver configured to synchronize the rising internal data with the rising data synchronization clock and synchronize the falling internal data with the falling data synchronization clock, generate preliminary pull-up data, and drive and output the generated preliminary pull-up data with driving abilitys according to the pull-up data duty control signals; and
- a pull-down mismatch compensation driver configured to synchronize the rising internal data with the rising data synchronization clock and synchronize the falling internal data with the falling data synchronization clock, generate preliminary pull-down data, and drive and output the generated preliminary pull-down data with driving abilitys according to the pull-down data duty control signals.

22. The data output circuit according to claim 21, wherein the data output driver generates the output data in response to outputs of the pull-up mismatch compensation driver and the pull-down mismatch compensation driver.

* * * * *